United States Patent [19]
Bell

[11] Patent Number: 5,767,018
[45] Date of Patent: Jun. 16, 1998

[54] METHOD OF ETCHING A POLYSILICON PATTERN

[75] Inventor: Scott A. Bell, San Jose, Calif.

[73] Assignee: Advanced Micro Devices, Inc., Sunnyvale, Calif.

[21] Appl. No.: 554,412

[22] Filed: Nov. 8, 1995

[51] Int. Cl.[6] .................................................. H01L 21/302
[52] U.S. Cl. .......................... 438/696; 438/733; 438/738; 438/742; 438/963; 438/743; 438/744
[58] Field of Search ........................ 437/228; 156/650.1, 156/651.1, 652.1, 653.1, 646.1, 657.1; 438/696, 720, 733, 738, 742, 743, 744, 906, 911, 963; 216/46

[56] References Cited

U.S. PATENT DOCUMENTS

| | | | |
|---|---|---|---|
| 4,214,946 | 7/1980 | Forget et al. | 156/643 |
| 4,314,875 | 2/1982 | Flamm | 156/643 |
| 4,343,677 | 8/1982 | Kinsbron et al. | 438/963 |
| 4,698,128 | 10/1987 | Berglund et al. | 438/963 |
| 4,799,991 | 1/1989 | Dockrey | 156/643 |
| 5,013,398 | 5/1991 | Long et al. | 156/643 |
| 5,017,513 | 5/1991 | Takeuchi | 438/963 |
| 5,118,387 | 6/1992 | Kadomura | 156/657.1 |
| 5,147,499 | 9/1992 | Szwejkowski et al. | 438/963 |
| 5,167,762 | 12/1992 | Carr et al. | 156/657 |
| 5,188,704 | 2/1993 | Babie et al. | 156/643 |
| 5,188,980 | 2/1993 | Lai | 437/193 |
| 5,242,536 | 9/1993 | Schoenborn | 156/643 |
| 5,271,799 | 12/1993 | Langley | 156/643 |
| 5,310,456 | 5/1994 | Kadomura | 156/657.1 |
| 5,369,686 | 11/1994 | Tatsumi et al. | 438/963 |
| 5,378,059 | 1/1995 | Roman et al. | 437/229 |
| 5,441,914 | 8/1995 | Taft et al. | 437/189 |
| 5,451,291 | 9/1995 | Park et al. | 438/963 |
| 5,474,615 | 12/1995 | Ishida et al. | 438/963 |
| 5,514,621 | 5/1996 | Tabara | 437/186 |
| 5,549,784 | 8/1996 | Carmody et al. | 156/643.1 |
| 5,630,904 | 5/1997 | Aoyama et al. | 438/963 |
| 5,643,407 | 7/1997 | Chang | 438/623 |
| 5,698,112 | 12/1997 | Naeher et al. | 156/644.1 |

FOREIGN PATENT DOCUMENTS

| | | |
|---|---|---|
| 0334525 | 9/1989 | European Pat. Off. . |
| 4-312921 | 3/1991 | Japan ..................... 21/320.5 |
| 5267568 | 10/1993 | Japan . |
| 6295887 | 10/1994 | Japan . |
| 8031800 | 2/1996 | Japan . |

OTHER PUBLICATIONS

S.M. Sze, VLSI Technology, McGraw–Hill Book Company, 2nd Edition, 1988, pp. 200–204.

Cheng et al., "A Downstream Plasma Process for Post–Etch Residue Cleaning," Semiconductor International, Jul. 1995, pp. 185–187.

*Primary Examiner*—R. Bruce Breneman
*Assistant Examiner*—Anita Alanko

[57] ABSTRACT

Pitting in active regions along the edges of a gate electrode when etching a composite comprising an anti-reflective coating on polysilicon is avoided by etching the anti-reflective coating with an etchant that forms a protective passivating coating on at least the sidewalls of the etched anti-reflective pattern and on the underlying polysilicon layer. Subsequently, anisotropic etching is conducted to remove the protective passivating coating from the surface of the polysilicon layer, leaving the etched anti-reflective pattern protected from the main polysilicon etch on at least its sidewalls by the passivating coating to prevent interaction. In another embodiment, the anti-reflective coating is etched without formation of a passivating coating, and the polysilicon layer subsequently etched with an etchant that forms a passivating coating.

47 Claims, 2 Drawing Sheets

METHOD OF ETCHING A POLYSILICON PATTERN

TECHNICAL FIELD

The present invention relates to a method of manufacturing a semiconductor device wherein a polycrystalline layer is etched to form a pattern. The invention is particularly applicable to etching a polycrystalline silicon layer to form a sub-half micron pattern.

BACKGROUND ART

The escalating requirements for high density and performance associated with ultra-large scale integration require responsive changes in conductive patterns, which is considered one of the most demanding aspects of ultra-large scale integration technology. High density demands for ultra-large scale integration semiconductor wiring require increasingly denser arrays with minimal spacing between conductive lines. This problem is difficult to resolve in manufacturing semiconductor devices having sub-micron technology, particularly for semiconductor devices having sub-half micron design features.

In accordance with conventional practices, sub-micron printing comprises the use of an anti-reflective coating (ARC) to minimize notches caused by reflections during photolithographic techniques. Sub-half micron printing, such as design features of about 0.35 microns, is normally conducted employing i-line lithographic techniques. Typically, an i-line photoresist is applied on a polysilicon layer to be etched with an organic ARC disposed therebetween. This type of arrangement is routinely utilized in the manufacture of semiconductor devices, particularly for forming gate electrodes.

A typical stack formed in patterning a gate electrode is shown in FIG. 1, wherein gate oxide layer 11 is formed on silicon substrate 10, and polysilicon layer 12 deposited thereon. In order to form a polycrystalline gate electrode having sub-half micron dimension, an ARC 13 is applied to polysilicon layer 12, and a photoresist mask pattern 14 formed on the ARC with opening 15. Conventionally, a first etchant is used to etch the ARC, and a second etchant is used to etch the polysilicon layer.

We discovered, however, that pitting occurred in active areas of the semiconductor substrate along the edge of the polysilicon lines after etching. The pitting problem is manifested by deep pits which decrease the reliability of the resulting semiconductor device.

Accordingly, a need exists for a method of etching a composite comprising sequential layers of polysilicon and an ARC on a substrate without attendant pitting of the substrate along the etched polysilicon pattern.

DISCLOSURE OF THE INVENTION

An object of the present invention is a method of manufacturing a semiconductor device by etching a composite comprising an ARC on a polysilicon layer in an efficient manner.

An object of the present invention is a method of manufacturing a semiconductor device having sub-half micron technology by etching a polysilicon line to form a gate electrode without attendant pitting of the underlying substrate adjacent edges of the polysilicon gate electrode.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a method of manufacturing a semiconductor device, which method comprises: etching a composite comprising a dielectric underlayer, a polysilicon layer on the dielectric underlayer, and a dielectric coating on the polysilicon layer, which method comprises: removing portions of the dielectric coating with a first etchant to form a dielectric pattern comprising sidewalls on the polysilicon layer, whereby a passivating coating is formed on at least a sidewall of the dielectric pattern and on the polysilicon layer; anisotropically etching the passivating coating with a second etchant to expose a portion of the polysilicon layer leaving a portion of the passivating coating on at least the sidewall of the dielectric pattern; and etching the polysilicon layer with a third etchant to form a polysilicon pattern.

Another aspect of the present invention is a method of manufacturing a semiconductor device, which method comprises: depositing a dielectric underlayer; depositing a layer of polysilicon on the dielectric underlayer; forming a dielectric coating on the polysilicon layer; removing a portion of the dielectric coating with a first etchant to form a dielectric pattern comprising sidewalls on the polysilicon layer, whereby a passivating polymer-containing coating is formed on at least a sidewall of the dielectric pattern and on the polysilicon layer; anisotropically etching the passivating coating with a second etchant to expose a portion of the polysilicon layer leaving a portion of the passivating coating on at least the sidewall of the dielectric pattern; and etching the polysilicon layer with a third etchant to form a pattern.

A further aspect of the present invention is a method of etching a composite comprising a dielectric underlayer, a polysilicon layer on the dielectric underlayer, and a dielectric coating on the polysilicon layer, which method comprises: removing portions of the dielectric coating with a first etchant to form a dielectric pattern comprising sidewalls on the polysilicon layer, whereby a passivating coating is not formed on the dielectric pattern or the polysilicon layer; and etching the polysilicon layer with a second etchant to form a polysilicon pattern, whereby a passivating coating is formed on the sidewalls of the etched dielectric pattern while the polysilicon layer is etched.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

Figure 1:
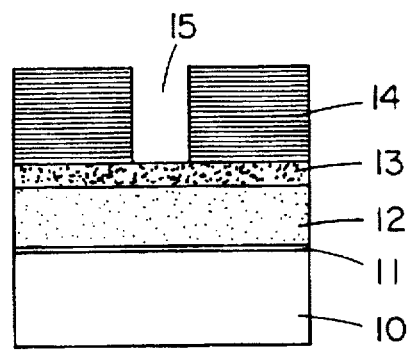
FIG. 1 schematically depicts a cross-sectional view of a composite stack before etching a gate electrode.

The present invention addresses and solves the problem of pitting which occurs in the active region of a substrate adjacent an etched polysilicon gate electrode in manufacturing a semiconductor device having minimal design features, such as sub-half micron design features. Prior to formulating a solution to the pitting problem, extensive research was undertaken to determine the cause of the problem, which cause was not apparent from the mere existence of deep pits in the substrate adjacent the side edges of an etched polysilicon gate electrode. Initially, the etching procedure which resulted in pitting was checked for hardware or process abnormalities; however, no such abnormalities were found. It was, however, determined that the majority of the active region was not pitted and, hence, the pitting phenomenon appeared to be localized rather than attributable to a general loss of selectivity to oxide. The single chamber etching procedure employed which resulted in such pitting is set forth in Table 1 below with respect to a silicon oxynitride (SiON) ARC.

TABLE 1

| Parameter | SiON Etch | Main Etch | Overetch |
|---|---|---|---|
| Pressure (mT) | 20 | 75 | 80 |
| Power (W) | 250 | 175 | 150 |
| B Field (G) | 100 | 30 | 30 |
| $SF_6$ flow (sccm) | 25 | — | — |
| HBr flow (sccm) | — | 88 | 45 |
| $Cl_2$ flow (sccm) | 25 | 18 | — |
| $He-O_2$ flow (sccm) | 5 | — | 5 |
| Time (sec) | 20 | EP (−45) + 10% | 50 |

Initial experimentation was conducted in a single chamber wherein a composite comprising a SiON ARC was etched. The SiON etch time and time beyond the main etch endpoint were varied, while other parameters were fixed as set forth in Table 1. The results are reported in Table 2.

TABLE 2

| Time Past Main | SiON etch time (sec) | | |
|---|---|---|---|
| Etch Endpoint (sec) | 15 | 20 | 25 |
| 0 | P | N | N |
| 5 | | | N |
| 10 | P | P | P |
| 15 | | | |
| 20 | P | P | P |

P = pitting observed
N = no pitting observed

Based upon the results reported in Table 2, several observations were made. Firstly, the tendency to pit appears to increase within increasing time past the endpoint. Secondly, the tendency to pit increases with decreasing SiON etch time, which is considered surprising since it was initially believed that the closer the ARC etch step came to the poly/oxide interface, the greater the possibility for the etchant to attack the gate oxide. Since the total time of the main etch step is increased when the ARC etch time is reduced, the second observation translates to an increase in pitting with increased exposure time to the main etch step (independent of time past endpoint).

Another series of experimental testing was conducted wherein wafers with and without a SiON ARC were etched with single and dual chambers. The results are summarized in Table 3.

TABLE 3

| Wafer Type | SiON | Process | Pitting |
|---|---|---|---|
| Integration | yes | 1 chamber | gross |
| Integration | no | 1 chamber | mild |
| Topography test | yes | 1 chamber | heavy |
| Topography test | no | 2 chamber | none |
| Topography test | yes | 2 chamber | heavy |
| Topography test | no | 2 chamber | mild |

One Chamber process: 25 $SF_6$/ 25 $Cl_2$/ 5 $He-O_2$ mT/250 W/100 G/15 or 20 sec + 88 HBr/18 $Cl_2$/75 mT/175 W/30 G/to EP + 20 sec 45 HBr/5 $He-O_2$/80 mT/150 W/30 G/50 sec + 15 sec w/o SiON, 20 sec w/SiON
Two Chamber Process: 61 $CHF_3$/10 $O_2$/30 mT/550 W/20 G/15 sec 43 $CF_4$/8 $O_2$/25 mT/75 W/O G/20 sec 88 HBr/18 $Cl_2$/75 mT/175 W/30 G/to EP + 20 sec 45 HBr/5 $He-O_2$/80 mT/150 W/30 G/50 sec In conducting the experimentation reported in Table 3, the "worst-case" conditions of 20 seconds beyond the endpoint was employed to exaggerate pitting. Based upon the results, it would appear that the presence of the SiON ARC layer greatly enhances the tendency for pitting regardless of the process employed. Notably, the two chamber process does not eliminate or even reduce the effect of the SiON ARC film. Since the polysilicon etch is common to both the one and two chamber processes, it was concluded that the pitting problem stems from an interaction between the main polysilicon etch process and the ARC. Since the polysilicon overetch step is heavily passivating, the main etch step appeared to interact with the SiON ARC.

Having discovered what was believed to be the source of the pitting problem, i.e., an interaction of the main polysilicon etch with the ARC, experimentation was then conducted to develop a solution to the pitting problem, i.e., a method of etching a composite comprising an ARC on a polysilicon layer without attendant pitting in an underlying active region of a substrate. Experimental testing was conducted employing the process as shown in Table 1 with variations of the main etch. The HBr+$Cl_2$ flow was set at 106 sccm. All wafers received a main etch to endpoint plus 20 seconds to exaggerate pitting and facilitate comparison. Inspections were performed on the JEOL tilt-SEM and the degree of pitting was ranked from 0 to 10, with 10 being the worst. Topography test wafers were employed. The results are summarized in Table 4.

TABLE 4

| Run | Pressure (mT) | Power (W) | B Field (G) | HBr/$Cl_2$ ratio | $He-O_2$ (sccm) | Degree of Pitting |
|---|---|---|---|---|---|---|
| 1 | 75 | 175 | 15 | 9.6 | 5 | 0 |
| 2 | 100 | 150 | 15 | 9.6 | 0 | 5 |
| 3 | 100 | 150 | 30 | 3.2 | 5 | 0 |
| 4 | 75 | 150 | 15 | 3.2 | 0 | 2 |
| 5 | 75 | 150 | 30 | 9.6 | 0 | 6 |
| 6 | 100 | 175 | 30 | 3.2 | 0 | 10 |

Based upon the results reported in Table 4, it was concluded that the $He-O_2$ flow has the greatest effect on pitting, i.e., increasing the $He-O_2$ flow reduces the tendency for pitting. Increasing the other parameters tends to increase the tendency to pit, with power being the most significant. The observed positive effect of increased $He-O_2$ supports the proposition that the ARC is interacting with the main poly etch process. By adding $He-O_2$ to the process, the amount of passivation on the sidewalls of the ARC is slightly increased and the chance for interaction reduced.

Experimental testing was then conducted employing a two-chamber process utilizing the parameters employed to obtain the results reported in Table 3, i.e., SiON etch (ch B): 61 $CHF_3$/10 $O_2$/30 mT/550 W/20 G/15 sec;

Polymer clean-up (ch B): 43 $CF_4$/8 $O_2$/25 mT/75 W/O G/20 sec;

Main poly etch (ch C): 88 HBr/18 $Cl_2$/75 mT/175 W/30 G/to EP+variable time;

Poly overetch (ch C): 45 HBr/5 He-$O_2$/80 mT/150 W/30 G/50 sec.

A polymer clean-up step was employed after the SiON ARC etch step. The formation of a passivating polymeric type coating, adversely affects the subsequent polysilicon etch step, as by reducing the uniformity of the surface topography. The time past the main etch endpoint was varied from 0 to 21 seconds. The results were as follows:

0 sec: no pitting 11 sec: mild pitting 21 sec: heavy pitting

The results reveal a definite improvement vis-à-vis a one-chamber process wherein pitting occurred at 0 seconds past the endpoint. However, the process margin is dangerously small. The experimental research further revealed a desirable consequence of the formation of a passivation coating which forms when employing etchants based upon fluorinated hydrocarbons. Accordingly, additional experimentation was conducted based upon a two-chamber process but omitting the polymer clean-up step. The process conditions and pitting as a function of time beyond the main etch point were as follows:

SiON etch (ch B): 61 $CHF_3$/10 $O_2$/30 mT/550 W/20 G/20 sec

Main poly etch (ch C): 88 HBr/18 $Cl_2$/75 mT/175 W/30 G/to EP+variable time

Poly overetch (ch C): 45 HBr/5 He-$O_2$/80 mT/150 W/30 G/50 sec.

0 sec: no pitting 10 sec: no pitting 20 sec: mild pitting

The above results reveal that the process margin was clearly extended by eliminating the polymer clean-up steps, although some mild pitting occurred at 20 seconds beyond the endpoint. However, the disadvantage of the process is that the main polysilicon etch is adversely affected by the polymer-containing passivating coating on its surface.

Thus, the experimental research suggested that an undesirable reaction occurred between the ARC and the main polysilicon etch, that such interaction can be prevented by the purposeful formation of a polymeric type of passivating coating employing an appropriate etchant for the ARC. However, the polymeric type of passivating coating disadvantageously affected the main polysilicon etch.

In accordance with the present invention, etchants are strategically selected for etching the ARC and for the polysilicon layer to avoid pitting in the active region. In a first embodiment of the present invention, the dielectric coating is etched using an etching recipe which does not deposit a polymeric coating. Such an etching recipe can include, for example, $SF_6$ and chlorine, in addition to helium and oxygen. Subsequently, the polysilicon layer is etched employing an etching recipe that does result in the formation of a passivating coating on at least the sidewalls of the etched dielectric pattern, thereby preventing interaction of the polysilicon etchant with the dielectric coating while the polysilicon layer is undergoing etching. Such a second etchant can comprise a halogenated hydrocarbon such as HBr, and additional include components such as $CL_2$, He and $O_2$. The He and $O_2$ flow is a known variable which can be optimized to achieve a passivating coating having a desired thickness, i.e., increasing the He and $O_2$ flow, increases the thickness of the passivating coating.

Figure 2A:
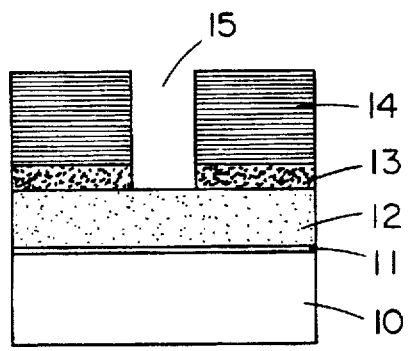
FIGS. 2A-2C schematically depict sequential etching steps in accordance with one embodiment of the present invention.
Figure 2B:
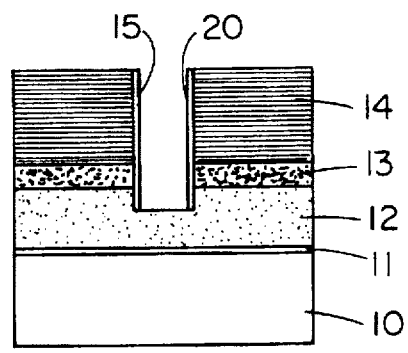
Figure 2C:
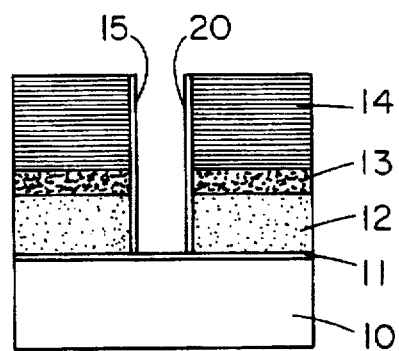

The first embodiment is schematically illustrated in FIGS. 2A–2C, wherein features similar to those in FIG. 1 bear similar reference numerals. As shown in FIG. 2A, ARC 13 is initially etched with an etchant, such as $SF_6$/$Cl_2$/He-$O_2$, which does not result in the deposition of a polymeric-type of coating. Such an etchant is selected to avoid the recognized undesirable formation of a polymeric type coating which hinders subsequent etching of the polysilicon layer. The undesirable formation of a polymer-containing coating is a recognized problem which occurs using certain hydrocarbon-containing etchants requiring complicated clean up procedures. See, for example, Cheng et al., "A Downstream Plasma Process for Post-Etch Residue Cleaning," Semiconductor International, July 1995, pp. 185–187.

Adverting to FIG. 2B, polysilicon layer 12 is then etched with a polysilicon etchant, such as HBr/$Cl_2$/He-$O_2$, which results in the deposition of a passivating coating 20 on the sidewalls of the etched dielectric pattern and on the sidewalls of the polysilicon layer 12 as the polysilicon layer 12 is etched. Passivating coating 20 prevents interaction of the polysilicon etchant with the dielectric pattern. Etching is continued to the endpoint as shown in FIG. 2C.

In a second embodiment of the present invention, initial etching of the dielectric coating is conducted with an etching recipe selected to form a passivating coating. However, an anisotropic polymer clean-up step is employed subsequent to the ARC etch. The anisotropic polymer clean-up step is designed to leave a polymeric passivating coating on the sidewalls of and/or encapsulate the patterned ARC while removing the passivating coating from the surface of the polysilicon layer. To achieve this objective, an $SF_6$/$Cl_2$/He-$O_2$ is employed. Testing was conducted employing such a two-chamber process in accordance with Table 5.

TABLE 5

| SiON etch (ch B): | 61 $CHF_3$/10 $O_2$/30 mT/550 W/20 G/20 sec |
|---|---|
| Polymer clean-up (ch C): | 25 $SF_6$/25 $Cl_2$/5 He-$O_2$/20 mT/250 W/100 G/10 sec |
| Main poly etch (ch C): | 88 HBr/18 $Cl_2$/75 mT/175 W/30 G/to EP |
| Poly overetch (ch C): | 45 HBr/5 He-$O_2$/80 mT/150 W/30 G/50 sec |

The two-chamber process set forth in Table 5 is characterized by the absence of pitting even after 20 seconds beyond the endpoint. An additional advantage observed is that the $SF_6$/$Cl_2$ etches polysilicon at a high rate and, therefore, shortens the main etch time, thereby improving the efficiency of the entire process. Moreover, the tendency to pit decreases with increased main etch times.

Further experimentation was then conducted to assess the basic concept of forming an organic and/or inorganic passivating coating, on at least the sidewalls of an etched ARC pattern and, subsequently, anisotropically etching the resulting passivating coating to expose the underlying polysilicon while leaving at least a portion of the passivating coating on the sidewalls of the etched ARC pattern, preferably encapsulating the ARC pattern. An integration lot was separated into eight three-wafer lots which processed over a five day period. All lots were inspected and found free of pitting.

Thus, in accordance with one embodiment of the present invention, pitting in an active region along the edges of a gate electrode is overcome by appropriate selection of the ARC etchant to avoid the formation of a passivating coating. Etching is then conducted to etched the polysilicon layer employing an etchant which forms a passivating coating on the sidewalls of the etch dielectric pattern as the polysilicon layer is etched. In another embodiment of the present invention, pitting in an active region along the edges of a gate electrode is overcome by appropriate selection of the ARC etchant to purposefully form a passivating coating, and subsequently anisotropically etching the passivating coating to expose the polysilicon layer while leaving a portion of the passivating coating on at least a sidewall of the etched ARC to prevent interaction with the main polysilicon etch, preferably encapsulating the etched ARC pattern. In the second embodiment, the first ARC etchant is selected to purposefully deposit a passivating coating, such as an etchant based upon a fluorinated hydrocarbon, e.g., $CHF_3/O_2$. A polymeric type of passivating coating is formed at least on the sidewalls of the etched ARC pattern, thereby preventing interaction of the ARC with the subsequent polysilicon etch. However, since the passivating coating on the polysilicon adversely affects etching of the polysilicon layer, anisotropic etching is conducted to remove the passivating coating from the surface of the polysilicon layer, leaving a portion of the passivating coating on at least the sidewalls of the etched ARC pattern.

Anisotropic etching is a well known technique, and any suitable etching recipe and appropriate conditions can be employed. It is, however, preferred to employ an anisotropic etching recipe which does not generate a passivating coating, as such would manifestly be counterproductive to the object of exposing the polysilicon layer. An anisotropic etching recipe comprising $SF_6/Cl_2/He-O_2$ has been found satisfactory.

Subsequent to anisotropic etching, processing is conducted in a conventional manner employing a main polysilicon etch and an overetch. For example, $HBr/Cl_2$ can be employed as the main polysilicon etch and $HBr/He-O_2$ as the overetch.

In carrying out the present invention, conventional ARC materials are employed and deposited in a conventional manner at a conventional thickness. For example, ARC layers typically comprises a silicon oxide, silicon nitride, silicon oxynitride, titanium nitride or titanium oxynitride. ARCs are applied to an appropriate functional thickness, such as up to about 1100 Å, and deposited by such technique as chemical vapor deposition or physical vapor deposition. In carrying out the second embodiment of the present invention, any ARC etchant capable of forming a passivating coating can be employed. Preferably, the ARC etchant comprises a fluorinated hydrocarbon, such as $CHF_3/O_2$.

The observed improvement in efficiency and elimination of the interaction between the ARC and the polysilicon etchant expands the applicability of the embodiments of the present invention to various phases in the manufacture of semiconductor devices apart from patterning a gate electrode. Thus, the present invention is generally applicable to patterning a polysilicon layer under a dielectric layer, as in manufacturing phases wherein the dielectric layer is used as a hard mask for etching an underlying polysilicon layer. In such cases, the dielectric material is formed at an appropriate thickness to function as a mask layer vis-à-vis an ARC.

In accordance with the present invention, a resist mask pattern is formed on the dielectric coating and portions of the dielectric coating removed with a first etchant to form a dielectric pattern having sidewalls extending down to and on an underlying polysilicon layer. In one embodiment, the first etchant is chosen so that a passivating coating is not formed. After the dielectric pattern has been etched, the polysilicon layer is etched with an etchant selected to form a passivating coating on the sidewalls of the etched dielectric pattern while the polysilicon layer it etched, thereby preventing interaction of the polysilicon etchant with the dielectric material. In another embodiment of the present invention, the first etchant is chosen so that a polymeric type of passivating coating is formed on at least a sidewall of and preferably encapsulating the etched dielectric pattern and on the polysilicon layer. Anisotropic etching is conducted with a second etchant to remove a portion of the passivating coating to expose a portion of the polysilicon layer, leaving the dielectric pattern protected by the passivating coating, thereby preventing interaction of a subsequent polysilicon etching recipe with the dielectric material. Thus, the present invention is not confined to the formation of a gate electrode, but enjoys utility in the patterning of polycrystalline layers at levels above the first level of a multi-level semiconductor device.

Figure 3A:
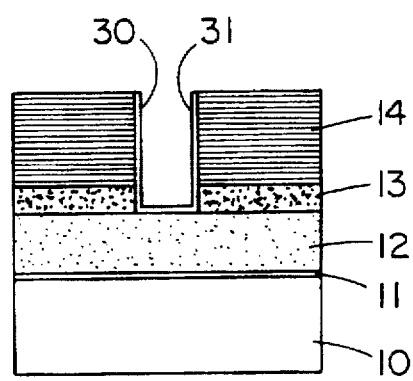
FIGS. 3A-3C schematically depict sequential etching steps in accordance with another embodiment of the present invention.
Figure 3B:
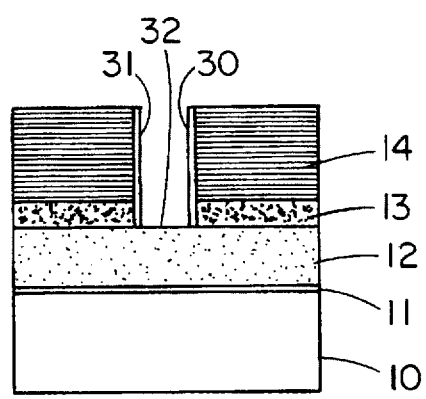
Figure 3C:
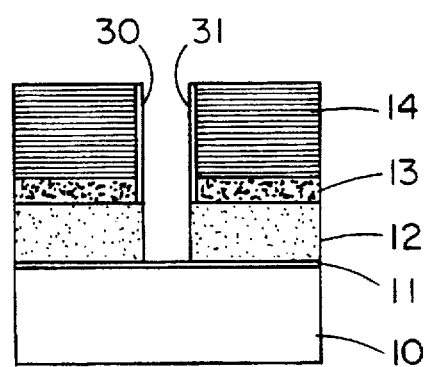

The second embodiment of the present invention is illustrated with respect to FIGS. 3A–3C, wherein similar elements bear similar reference numerals. An initial dielectric layer 11, typically serving as a gate oxide, is formed on semiconductor substrate, and a layer of polysilicon and ARC 13 sequentially formed thereon. Patterned photomask 14 is formed on ARC 13 which is etched with an appropriate etchant, preferably a fluorinated hydrocarbon, such as $CHF_3/O_2$, whereby a polymeric type of passivating coating 31 is formed on the polysilicon layer and as the sidewalls of the etched ARC pattern. As shown in FIG. 3B, anisotropic etching is conducted to remove the polymeric type of passivating coating 30 from the surface of polysilicon layer 12 at 32, leaving the passivating coating on the ARC sidewalls. Anisotropic etching can be conducted employing $SF_6/Cl_2/He-O_2$. $NF_3$ can be employed in lieu of $Cl_2$.

As shown in FIG. 3C, polysilicon layer 12 is etched employing a conventional polysilicon etchant, such as $HBr/Cl_2$. The formation of polymeric coating 30 on at least the sidewalls of ARC 13 prevents interaction of ARC 13 with the main polysilicon etch, thereby preventing pitting in the active region at the side surfaces of the etched polysilicon pattern.

The present invention enjoys utility during various phases in the manufacture of the semiconductor device, including the formation of a gate electrode as well as etching polysilicon patterns at upper levels. In carrying out the present invention, conventional equipment can be employed and, hence, is not set forth in great detail. In conducting the various steps of the present invention, the particular etching conditions as well as ratios of ingredients can be optimized by one having ordinary skill in the art in a particular situation by routine adjustment of the known parameters. For example, in etching the ARC in accordance with the second embodiment of the present invention, the amount of oxygen can be varied to control the amount of polymer formed, i.e., as the amount of oxygen increases, the amount of polymeric passivating coating increases. One having ordinary skill in the art can easily optimize the thickness of the polymeric coating formed in accordance with the present invention in order to achieve the objective of protecting the etched ARC pattern from interaction with the polysilicon etch. It has been found that a passivating coating thickness between 50 and 1000 Å is suitable, preferably a thickness of about 100 to about 300 Å.

The first embodiment of the present invention can be conducted in a single chamber. In conducting the second embodiment of the present invention, the initial etching of the ARC is preferably conducted in a one chamber and the remaining steps conducted in a different second chamber. The present invention has an applicability in submicron technology, particularly sub-half micron technology, such as 0.35 micron technology and below.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

I claim:

1. A method of etching a composite comprising a dielectric underlayer, a polysilicon layer on the dielectric underlayer, and a dielectric coating on the polysilicon layer, which method comprises:

removing portions of the dielectric coating with a first etchant to form a dielectric pattern comprising sidewalls on the polysilicon layer, whereby a passivating coating is formed on at least a sidewall of the dielectric pattern and on the polysilicon layer;

anisotropically etching the passivating coating with a second etchant to expose a portion of the polysilicon layer leaving a portion of the passivating coating on at least the sidewall of the dielectric pattern; and etching the polysilicon layer with a third etchant to form a polysilicon pattern.

2. The method according to claim 1, further comprising overetching with a fourth etchant to remove a portion of the dielectric underlayer.

3. The method according to claim 1, wherein the dielectric coating comprises a material selected from the group consisting of a silicon oxide, silicon nitride, silicon oxynitride, titanium nitride and titanium oxynitride.

4. The method according to claim 1, wherein the first etchant comprises oxygen.

5. The method according to claim 4, wherein the first etchant further comprises a fluorinated hydrocarbon.

6. The method according to claim 5, wherein the fluorinated hydrocarbon is $CHF_3$.

7. The method according to claim 1, wherein the second etchant comprises $SF_6$, $Cl_2$, He and $O_2$.

8. The method according to claim 1, wherein the third etchant comprises HBr and $Cl_2$.

9. The method according to claim 2, wherein the fourth etchant comprises HBr, He and $O_2$.

10. The method according to claim 1, wherein the etched dielectric pattern is encapsulated with the passivating coating, and the dielectric pattern remains encapsulated with the passivating coating after anisotropic etching.

11. The method according to claim 1, wherein the passivating coating comprises an inorganic or organic material.

12. The method according to claim 11, wherein the passivating coating comprises an organic polymer.

13. The method according to claim 1, wherein the dielectric coating is etched in a first chamber and the subsequent etching steps are conducted in a different second chamber.

14. The method according to claim 1, wherein the passivating coating has a thickness of about 50 to about 1000 Å.

15. The method according to claim 14, wherein the passivating coating has a thickness of about 100 to about 300 Å.

16. The method according to claim 1, comprising: forming a dielectric underlayer;

depositing a polysilicon layer on the dielectric underlayer;

depositing a dielectric coating on the polysilicon layer;

forming a resist mask pattern on the dielectric coating;

removing portions of the dielectric coating with a first etchant to form a dielectric pattern comprising sidewalls on the polysilicon layer, whereby a passivating organic polymeric coating is formed encapsulating the dielectric pattern and on the polysilicon layer;

anisotropically etching the passivating coating with a second etchant to expose a portion of the polysilicon layer, leaving the dielectric pattern encapsulated with the passivating coating;

etching the polysilicon layer with a third etchant to form a pattern; and overetching with a fourth etchant to remove a portion of the dielectric layer.

17. The method according to claim 16, further comprising depositing the dielectric underlayer on a semiconductor substrate;

depositing a dielectric anti-reflective material on the polysilicon layer; and etching the polysilicon layer to form a gate electrode of a transistor.

18. The method according to claim 16, wherein the first etchant comprises oxygen and a fluorinated hydrocarbon.

19. The method according to claim 18, wherein the fluorinated hydrocarbon is $CHF_3$.

20. The method according to claim 16, wherein the second etchant comprises $SF_6$, $Cl_2$, He and $O_2$.

21. A method of manufacturing a semiconductor device, which method comprises:

depositing a dielectric underlayer;

depositing a layer of polysilicon on the dielectric underlayer;

forming a dielectric coating on the polysilicon layer;

removing a portion of the dielectric coating with a first etchant to form a dielectric pattern comprising sidewalls on the polysilicon layer, whereby a passivating polymer-containing coating is formed on at least a sidewall of the dielectric pattern and on the polysilicon layer;

anisotropically etching the passivating coating with a second etchant to expose a portion of the polysilicon layer leaving a portion of the passivating coating on at least the sidewall of the dielectric pattern; and etching the polysilicon layer with a third etchant to form a pattern.

22. The method according to claim 21, further comprising overetching to remove a portion of the dielectric underlayer with a fourth etchant.

23. The method according to claim 21, further comprising:

depositing the dielectric underlayer on a semiconductor substrate;

depositing a dielectric coating comprising an anti-reflective material selected from the group consisting of a silicon oxide, silicon nitride, silicon oxynitride, titanium nitride, and titanium oxynitride on the polysilicon layer;

forming a resist mask pattern on the dielectric anti-reflective coating; and etching the polysilicon layer to form a gate electrode of a transistor.

24. The method according to claim 21, wherein the first etchant comprises a fluorinated hydrocarbon and oxygen.

25. The method according to claim 24, wherein the fluorinated hydrocarbon is $CHF_3$.

26. The method according to claim 21, wherein the second etchant comprises $SF_6$, $Cl_2$, He and $O_2$.

27. The method according to claim 21, wherein the passivating coating encapsulates the dielectric pattern, and the dielectric pattern remains encapsulated with the passivating coating after anisotropic etching.

28. The method according to claim 21, wherein the dielectric coating is etched in a first chamber and the subsequent etching steps are conducted in a different second chamber.

29. The method according to claim 21, wherein the passivating coating has a thickness of about 50 to about 1000 Å.

30. The method according to claim 29, wherein the passivating coating has a thickness of about 100 to about 300 Å.

31. The method according to claim 23, wherein the anti-reflective material is a silicon oxynitride.

32. The method according to claim 1, comprising etching the polysilicon layer using the etched dielectric coating as a hard mask.

33. The method according to claim 21, comprising etching the polysilicon layer using the etched dielectric coating as a hard mask.

34. A method of etching a composite comprising a dielectric underlayer, a polysilicon layer on the dielectric underlayer, and a dielectric coating on the polysilicon layer, which method comprises:

removing portions of the dielectric coating with a first etchant to form a dielectric pattern comprising sidewalls on the polysilicon layer, whereby a passivating coating is not formed on the dielectric pattern or the polysilicon layer; and etching the polysilicon layer with a second etchant to form a polysilicon pattern, whereby a passivating coating is formed on the sidewalls of the etched dielectric pattern while the polysilicon layer is etched.

35. The method according to claim 34, further comprising overetching with a third etchant to remove a portion of the dielectric underlayer.

36. The method according to claim 34, wherein the dielectric coating comprises a material selected from the group consisting of a silicon oxide, silicon nitride, silicon oxynitride, titanium nitride and titanium oxynitride.

37. The method according to claim 34, wherein the first etchant comprises $SF_6$.

38. The method according to claim 37, wherein the first etchant further comprises $Cl_2$, He and $O_2$.

39. The method according to claim 34, wherein the second etchant comprises He and $O_2$.

40. The method according to claim 39, wherein the second etchant further comprises HBr and $Cl_2$.

41. The method according to claim 34, wherein the passivating coating comprises an inorganic or organic material.

42. The method according to claim 41, wherein the passivating coating comprises an organic polymer.

43. The method according to claim 42, wherein the passivating coating has a thickness of about 50 to about 1000 Å.

44. The method according to claim 43, wherein the passivating coating has a thickness of about 100 to about 300 Å.

45. The method according to claim 34, further comprising:

depositing the dielectric underlayer on a semiconductor substrate;

depositing a dielectric anti-reflective coating on the polysilicon layer; and etching the polysilicon layer to form a gate electrode of a transistor.

46. The method according to claim 34, comprising etching the polysilicon layer using the etched dielectric coating as a hard mask.

47. The method according to claim 34, comprising etching the dielectric coating and polysilicon layer in the same chamber.

* * * * *